United States Patent
Park

(10) Patent No.: US 9,672,149 B2
(45) Date of Patent: Jun. 6, 2017

(54) PARTIAL PAGE PROGRAMMING OF NONVOLATILE MEMORY DEVICE

(71) Applicant: SAMSUNG ELECTRONICS CO., LTD., Suwon-si, Gyeonggi-do (KR)

(72) Inventor: Sang-Soo Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 66 days.

(21) Appl. No.: 14/585,286

(22) Filed: Dec. 30, 2014

(65) Prior Publication Data

US 2015/0228344 A1    Aug. 13, 2015

(30) Foreign Application Priority Data

Feb. 13, 2014  (KR) .................. 10-2014-0016367

(51) Int. Cl.
| | | |
|---|---|---|
| G06F 12/00 | (2006.01) | |
| G06F 12/02 | (2006.01) | |
| G11C 16/12 | (2006.01) | |
| G11C 7/10  | (2006.01) | |

(52) U.S. Cl.
CPC ...... *G06F 12/0246* (2013.01); *G06F 12/0238* (2013.01); *G11C 16/12* (2013.01); *G06F 2212/1036* (2013.01); *G06F 2212/7201* (2013.01); *G06F 2212/7203* (2013.01); *G11C 7/1006* (2013.01)

(58) Field of Classification Search
CPC ............ G06F 12/0238; G06F 12/0246; G06F 2212/1036; G06F 2212/7201; G06F 2212/7203; G11C 7/1006; G11C 16/12
See application file for complete search history.

(56) References Cited

U.S. PATENT DOCUMENTS

| | | |
|---|---|---|
| 8,199,583 B2 | 6/2012 | Kim et al. |
| 8,316,177 B2 | 11/2012 | Conley |
| 8,386,696 B2 | 2/2013 | Kim et al. |
| 2007/0081386 A1 | 4/2007 | Yoon |
| 2009/0070520 A1* | 3/2009 | Mizushima ......... G06F 12/0246 711/103 |
| 2009/0198877 A1* | 8/2009 | Pua ....................... G06F 13/385 711/103 |
| 2010/0070682 A1* | 3/2010 | Wan ..................... G06F 12/0246 711/103 |
| 2010/0257308 A1 | 10/2010 | Hsu et al. |
| 2012/0020156 A1 | 1/2012 | Choi et al. |
| 2012/0159058 A1 | 6/2012 | Yonezawa et al. |
| 2012/0260149 A1 | 10/2012 | Chang et al. |
| 2013/0246891 A1 | 9/2013 | Manning et al. |

FOREIGN PATENT DOCUMENTS

JP        P2006323626 A    11/2006

* cited by examiner

*Primary Examiner* — Kalpit Parikh
(74) *Attorney, Agent, or Firm* — Volentine & Whitt, PLLC

(57) ABSTRACT

In one embodiment of the inventive concept, a partial page program method is provided for a system comprising a nonvolatile memory device. The method comprises loading random data stored in the nonvolatile memory device into a page buffer circuit in the nonvolatile memory device, reloading partial page data having a size corresponding to a portion of one page into the page buffer circuit after the random data is loaded by receiving the partial page data from a memory controller, and programming, to a target page, page data stored in the page buffer circuit after the random data is loaded and the partial page data is reloaded.

12 Claims, 12 Drawing Sheets

PARTIAL PAGE PROGRAMMING OF NONVOLATILE MEMORY DEVICE

CROSS-REFERENCE TO RELATED APPLICATIONS

This application claims priority under 35 U.S.C. §119 to Korean Patent Application No. 10-2014-0016367 filed on Feb. 13, 2014, the subject matter of which is hereby incorporated by reference.

BACKGROUND OF THE INVENTION

The inventive concept relates generally to nonvolatile memory devices and, more particularly, to partial page programming of nonvolatile memory devices.

Data is programmed to a nonvolatile memory device by changing threshold voltages of its memory cells, and data is read from a nonvolatile memory device by identifying correspondences between threshold voltages of memory cells and threshold voltage distributions representing different data states.

In a nonvolatile memory device where data is programmed on a page-by-page basis, even if data corresponding to a sub-portion of one page (referred to as "partial page data") is required to be programmed, data corresponding to the entire page (referred to as "full page data") is transferred or input from a memory controller to the nonvolatile memory device. As the storage capacity of the nonvolatile memory device increases, the page size of the nonvolatile memory device tends to increase accordingly. Thus, the data transfer (or input) time and program time for the full page data may increase.

SUMMARY OF THE INVENTION

In one embodiment of the inventive concept, a partial page program method is provided for a system comprising a nonvolatile memory device. The method comprises loading random data stored in the nonvolatile memory device into a page buffer circuit in the nonvolatile memory device, reloading partial page data having a size corresponding to a portion of one page into the page buffer circuit after the random data is loaded by receiving the partial page data from a memory controller, and programming, to a target page, page data stored in the page buffer circuit after the random data is loaded and the partial page data is reloaded.

In another embodiment of the inventive concept a partial page program method is provided for a system comprising a nonvolatile memory device. The method comprise receiving an address of a target page from a memory controller, receiving a random data read command from the memory controller, loading random data into a page buffer circuit by reading the random data from a random data page corresponding to the address of the target page in response to the random data read command, reloading partial page data having a size corresponding to a portion of one page into the page buffer circuit where the random data is loaded by receiving the partial page data from the memory controller, receiving a page program confirm command from the memory controller, and programming page data stored in the page buffer circuit to the target page in response to the page program confirm command.

In still another embodiment of the inventive concept, a system comprises a nonvolatile memory device comprising a page buffer circuit and a memory cell array, and configured to load random data from the memory cell array into the page buffer circuit, to reload partial page data having a size corresponding to a portion of one page into the page buffer circuit after the random data is loaded, by receiving the partial page data from a memory controller, and to program, to a target page, page data stored in the page buffer circuit after the random data is loaded and the partial page data is reloaded.

These and other embodiments of the inventive concept can potentially improve the performance of a memory system comprising a nonvolatile memory device by providing a partial page program method that reduces a data transfer (input) time and a program time.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "on," "connected to" or "coupled to" another feature, it can be directly on, connected or coupled to the other feature or intervening features may be present. As used herein, the term "and/or" includes any and all combinations of one or more of the associated listed items.

Although the terms first, second, third etc. may be used herein to describe various features, the described features should not be limited by these terms. Rather, these terms are used merely to distinguish one feature from another. Thus, a first feature could be termed a second feature, and vice versa, without departing from the scope of the inventive concept.

The terminology used herein is for the purpose of describing embodiments only and is not intended to be limiting of the inventive concept. As used herein, the singular forms "a," "an" and "the" are intended to include the plural forms as well, unless the context clearly indicates otherwise. The terms "comprises" and/or "comprising," where used in this specification, specify the presence of stated features but do not preclude the presence or addition of one or more other features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

Figure 1:
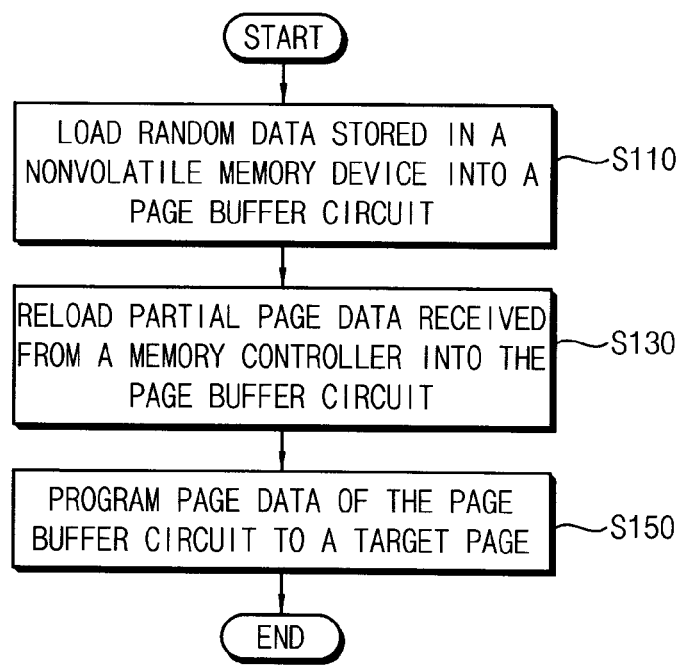
FIG. 1 is a flow chart illustrating a partial page program method for a nonvolatile memory device according to an embodiment of the inventive concept.
Figure 2:
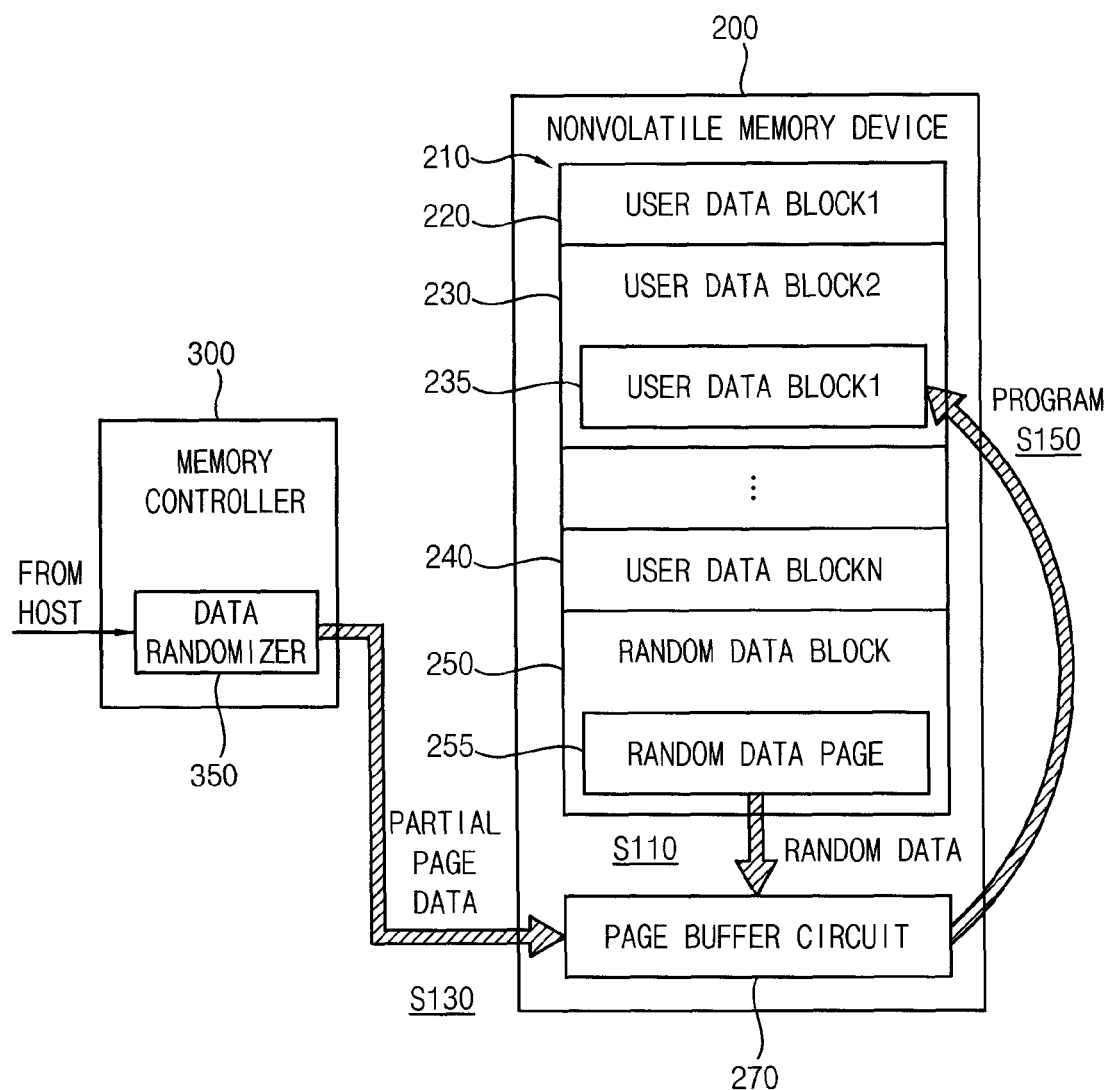
FIG. 2 is a block diagram illustrating a memory controller and a nonvolatile memory device configured to perform the partial page program method of FIG. 1.

FIG. 1 is a flow chart illustrating a partial page program method for a nonvolatile memory device according to an embodiment of the inventive concept, and FIG. 2 is a block diagram illustrating a memory controller 300 and a nonvolatile memory device 200 configured to perform the partial page program method of FIG. 1.

Referring to FIGS. 1 and 2, to perform a partial page program operation, nonvolatile memory device 200 loads random data that is previously stored in nonvolatile memory device 200 into a page buffer circuit 270 (S110). The random data may be previously stored in at least one random data page 255 in nonvolatile memory device 200. Here, the random data may mean randomized data that is generated by randomizing certain data (e.g., user data or other data), and it may be different from random access data that can be accessed at arbitrary positions.

Nonvolatile memory device 200 comprises a memory cell array 210 having multiple memory blocks 220, 230, 240 and 250. At least one memory block 250 of memory blocks 220, 230, 240 and 250 may be designated as a random data block 250 for storing the random data, and other blocks 220, 230 and 240 may be designated as user data blocks 220, 230 and 240 for storing user data. In some embodiments, each user data block 220, 230 and 240 may be a multi-level cell (MLC) block, and random data block 250 may be a single level cell (SLC) block.

Random data block 250 comprises at least one random data page 255 that stores the random data having a size corresponding to one page. Where nonvolatile memory device 200 receives a partial page program request from a memory controller 300, nonvolatile memory device 200 loads the random data having the size corresponding to one page into page buffer circuit 270 by reading the random data from random data page 255.

In some embodiments, the random data is programmed to random data block 250 by memory controller 300 before the partial page program operation is performed. For example, where nonvolatile memory device 200 and memory controller 300 perform an initialization operation (e.g., an initial boot operation), memory controller 300 may generate the random data using a data randomizer 350, and the generated random data may be programmed to the designated random data block 250 in nonvolatile memory device 200.

In some embodiments, memory controller 300 periodically updates the random data stored in random data block 250. For example, where the number of random data read operations for random data block 250 exceeds a predetermined value, memory controller 300 may control nonvolatile memory device 200 to perform an erase operation for random data block 250, and it may program new random data to random data block 250 by generating the new random data, which may be different from or the same as previous random data. In other embodiments, the random data may be generated by a random data generator in nonvolatile memory device 200, and it may be programmed to random data block 250 in nonvolatile memory device 200 without receiving the random data from memory controller 300.

A read time (or a data transfer time (tR) from random data page 255 to page buffer circuit 270) of a random data read operation (or a data transfer operation from random data page 255 to page buffer circuit 270) that reads the random data from random data page 255 to page buffer circuit 270 may be shorter than a read time (or a data transfer time (tR) from a user data page to page buffer circuit 270) of a user data read operation (or a data transfer operation from the user data page to page buffer circuit 270) that reads user data from the user data page to page buffer circuit 270. For example, the random data read operation may have a precharge time and a sensing time respectively shorter than a precharge time and a sensing time of the user data read operation, and thus the random data read operation may be performed faster than the user data read operation. Further, the random data that is read from random data page 255 by the random data read operation may not be output to memory controller 300, an error correction operation for the random data may not be performed, and a read retry operation for reducing errors of the read random data may not be performed. Thus, even if the random data read by the random data read operation comprises error bits, any correction or retry may not be performed for rapid completion of the random data read operation. In some embodiments, random data block 250 may be a single level cell block, and random data page 255 may be a single level cell page. In this case, the random data read operation may be performed more rapidly.

In some embodiments, nonvolatile memory device 200 receives an address of a target page from memory controller 300, and it receives a random data read command from memory controller 300. Nonvolatile memory device 200 may perform the random data read operation for a random data page corresponding to the address of the target page in response to the random data read command. In other embodiments, nonvolatile memory device 200 may receive a random data read command from memory controller 300, may receive an address of a random data page from memory controller 300, and may receive a random data read confirm command from memory controller 300. Nonvolatile memory device 200 may perform the random data read operation for the random data page having the received address in response to the random data read confirm command.

Nonvolatile memory device 200 receives partial page data having a size corresponding to a portion of one page from memory controller 300, and it reloads the partial page data received from memory controller 300 into page buffer circuit 270 where the random data is loaded (S130). In some embodiments, memory controller 300 receives the partial page data from a host, randomizes the received partial page data using data randomizer 350, and provides the randomized partial page data to page buffer circuit 270 of nonvolatile memory device 200. Thus, in some embodiments, the partial page data reloaded into page buffer circuit 270 is randomized data. By reloading the partial page data, the partial page data may be stored (or overwritten) in one portion of page buffer circuit 270, and the random data (e.g., a portion of the random data having a size corresponding to one page) may be stored (or remain) in the remaining portion of page buffer circuit 270. Thus, page buffer circuit 270 may store page data comprising the partial page data in the one portion and the random data in the remaining portion.

Nonvolatile memory device 200 programs, to a target page 235 of user data block 230, the page data stored in page buffer circuit 270 where the random data is loaded and the partial page data is reloaded (S150). Because page buffer circuit 270 stores the partial page data in the one portion and the random data in the remaining portion, the partial page data may be programmed to one portion of target page 235, and the random data (e.g., a portion of the random data having the size corresponding to one page) may be programmed to the remaining portion of target page 235. As described above, although memory controller 300 transfers only the partial page data having a size corresponding to a portion of one page, the randomized data (including the partial page data and the random data) may be stored in the entire target page 235.

If data having a fixed value (e.g., 0 or 1) is stored in at least a portion of each page, reliability of a nonvolatile memory device may be deteriorated. For example, where most of memory cells in one string are in a programmed state, resistance of the string may be increased, and a memory cell having an erased state in the string may be inaccurately read as having the programmed state. Further, where most of memory cells in one string are in the erased state, memory cells having the erased state may be gradually programmed by a read disturbance. Accordingly, to maintain the reliability of the nonvolatile memory device, randomized data should be stored in each page. To achieve this, in a conventional nonvolatile memory device, although partial page data having a size corresponding to a portion of one page are required to be programmed, full page data having a size corresponding to the entire page are input from a memory controller to the nonvolatile memory device. Accordingly, a data input time (or a data loading time) from the memory controller to the nonvolatile memory device is increased, and a program time is increased.

However, in a partial page program method according to an embodiment of the inventive concept, because the random data stored in nonvolatile memory device 200 is previously loaded, although the partial page data is input or loaded from memory controller 300, randomized data may be programmed to the entire target page 235. Accordingly, the data input time from memory controller 300 to nonvolatile memory device 200 may be reduced. Further, because the random data read operation for loading the random data into page buffer circuit 270 is rapidly performed, the entire program time may be reduced.

As described above, in the partial page program method for nonvolatile memory device 200, the random data stored in nonvolatile memory device 200 is loaded into page buffer circuit 270 before the partial page data is input to nonvolatile memory device 200, and thus randomized data may be programmed to the entire target page 235 without full-page data loading from memory controller 300. Further, because not the full-page data but the partial page data is input from memory controller 300 to nonvolatile memory device 200, the data input time and the program time may be reduced by the partial page program method according to an embodiment of the inventive concept.

Figure 3:
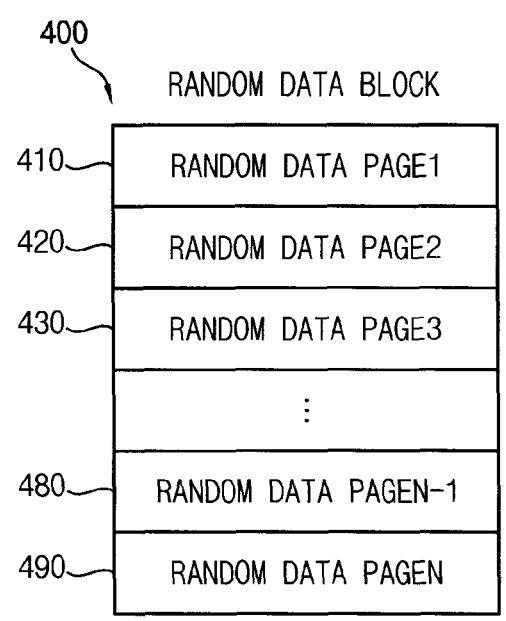
FIG. 3 is a block diagram illustrating an example of a random data block in a nonvolatile memory device according to an embodiment of the inventive concept.
Figure 4:
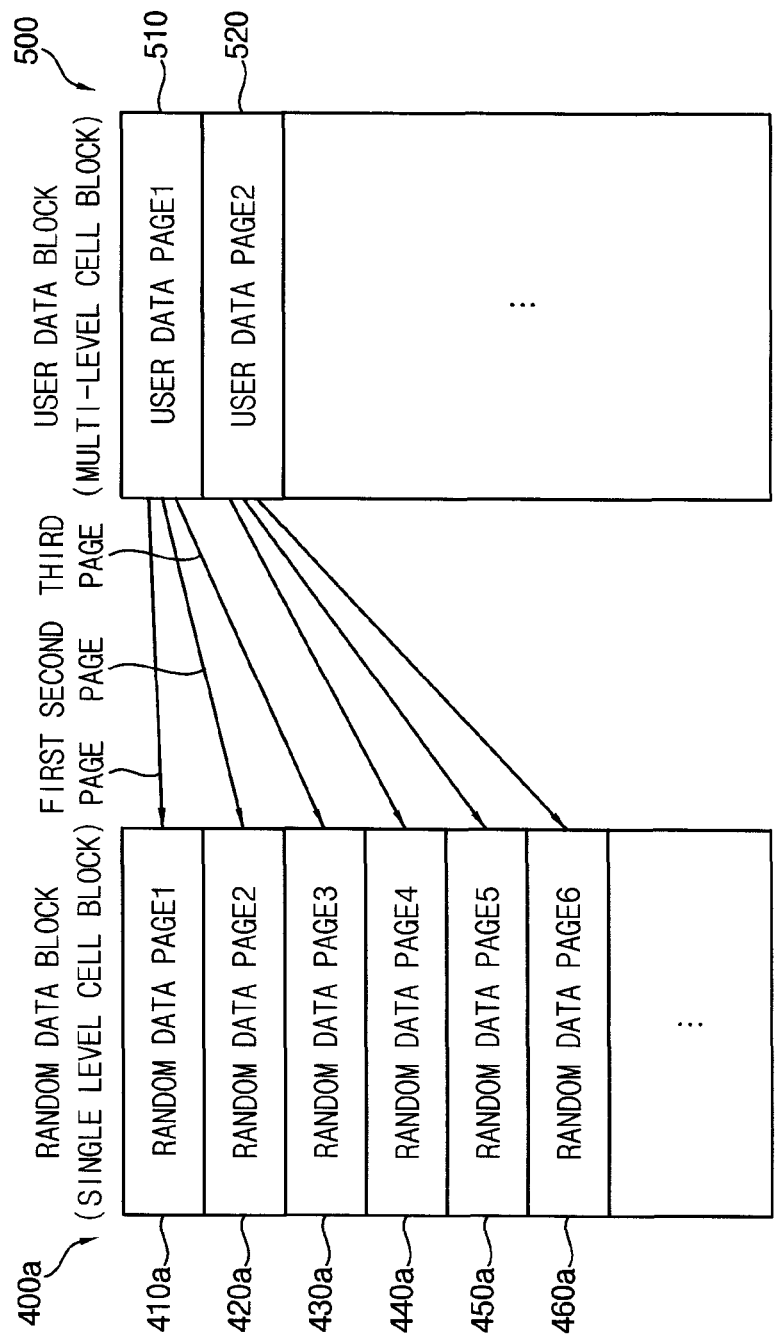
FIG. 4 is a diagram for describing an example of selection of a random data page from a random data block.
Figure 5:
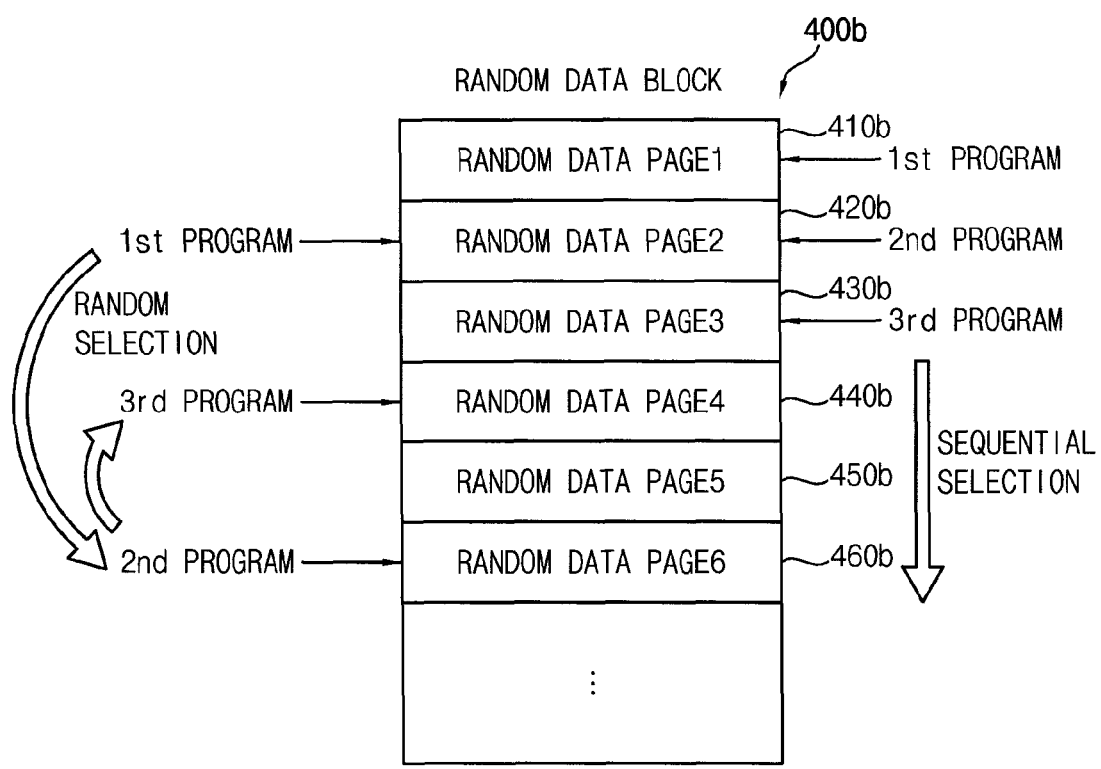
FIG. 5 is a diagram for describing another example of selection of a random data page from a random data block.
Figure 6:
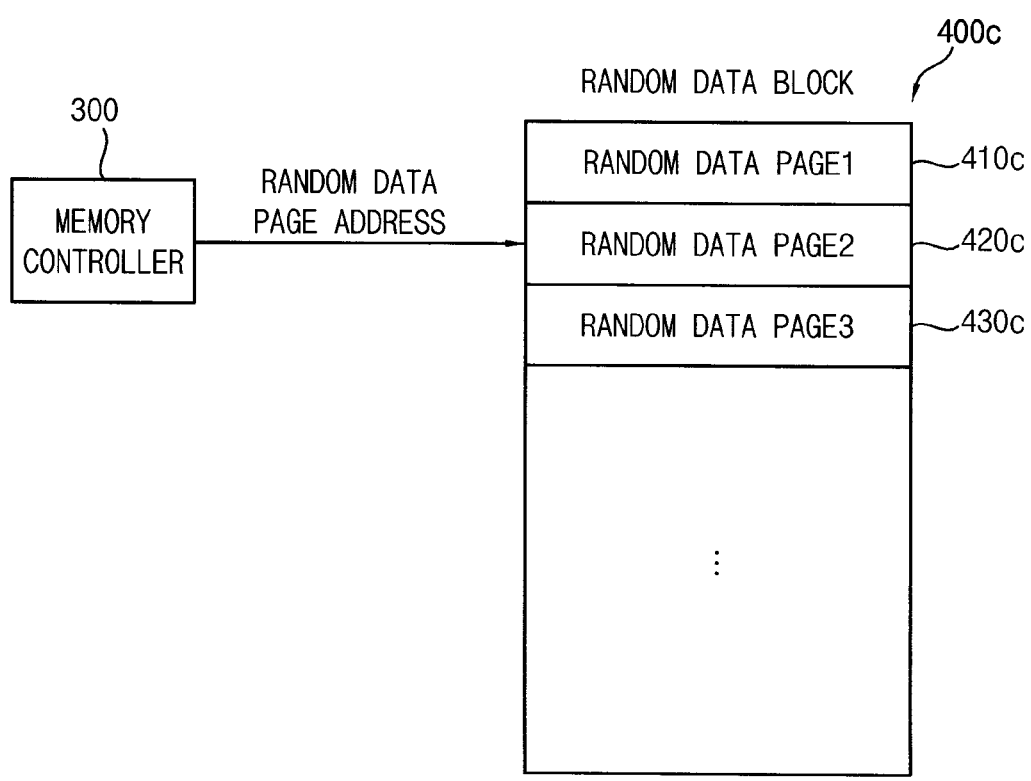
FIG. 6 is a diagram for describing still another example of selection of a random data page from a random data block.

FIG. 3 is a block diagram illustrating an example of a random data block in a nonvolatile memory device according to an embodiment of the inventive concept, FIG. 4 is a diagram for describing an example of selection of a random data page from a random data block, FIG. 5 is a diagram for describing another example of selection of a random data page from a random data block, and FIG. 6 is a diagram for describing still another example of selection of a random data page from a random data block.

Referring to FIG. 3, a nonvolatile memory device comprises at least one random data block 400, and random data block 400 comprises multiple random data pages 410, 420, 430, 480 and 490.

Before a partial page program operation is performed, random data is programmed to random data pages 410, 420, 430, 480 and 490 of random data block 400. In some embodiments, the random data is programmed to random data block 400 by a memory controller. For example, the memory controller may generate the random data using a data randomizer, and may control the nonvolatile memory device to program the generated random data to random data block 400. In some embodiments, the memory controller periodically updates the random data stored in random data block 400. For example, where the number of random data read operations for random data block 400 exceeds a predetermined value, the memory controller may control the nonvolatile memory device to perform an erase operation for random data block 400, and may program new random data to random data block 400 by generating the new random data. In other embodiments, the random data may be generated by a random data generator in the nonvolatile memory device, and may be programmed to random data block 400 without receiving the random data from the memory controller.

Where random data is stored in one random data page, and the same random data is used each time a partial page program operation is performed, the same or similar data is programmed to respective user data pages. In this case, reliability of a nonvolatile memory device may be deteriorated. To prevent this deterioration of reliability, where the partial page program operation is performed, one random data page may be selected from the random data pages 410, 420, 430, 480 and 490 in random data block 400, and the random data may be read from the selected random data page to a page buffer circuit.

In some embodiments, the random data page from which the random data is read is selected from the random data pages 410, 420, 430, 480 and 490 according to an address of a target page to which partial page data is programmed. For example, as illustrated in FIG. 4, at least one corresponding random data page 410a, 420a, 430a, 440a, 450a and 460a may be previously designated for each user data page 510 and 520 in a user data block 500.

For example, first through third random data pages 410a, 420a and 430a of a random data block 400a that is a single level cell block may be designated for a first user data page 510 of a user data block 500 that is a multi-level cell block (e.g., a 3-bit memory cell block), and fourth through sixth random data pages 440a, 450a and 460a of random data block 400a may be designated for a second user data page 520 of user data block 500. In this case, where a partial page program operation for a first page (e.g., a least significant bit (LSB) page) of first user data page 510 is performed, random data may be read from first random data page 410*a* to a page buffer circuit, and, where a partial page program operation for a third page (e.g., a most significant bit (MSB) page) of second user data page 520 is performed, random data may be read from sixth random data page 460*a* to the page buffer circuit. As described above, different random data pages may be designated for adjacent user data pages, and thus different random data may be programmed to the adjacent user data pages. Accordingly, the deterioration of the reliability of the nonvolatile memory device may be prevented. Although FIG. 4 illustrates one example of random data page designation, the random data page designation according to an embodiment of the inventive concept is not limited thereto.

In other embodiments, the random data page from which the random data is read may be selected sequentially from the random data pages 410, 420, 430, 480 and 490 each time the random data read operation is performed. For example, as illustrated in FIG. 5, a random data block 400*b* comprises first through sixth random data pages 410*b*, 420*b*, 430*b*, 440*b*, 450*b* and 460*b*, and the first through sixth random data pages 410*b*, 420*b*, 430*b*, 440*b*, 450*b* and 460*b* may be sequentially selected each time the random data read operation is performed. For example, where a first partial page program operation is performed, a random data read operation for first random data page 410*b* may be performed, and when a subsequent second partial page program operation is performed, a random data read operation for second random data page 420*b* may be performed. As described above, random data read operations for different random data pages 410*b*, 420*b*, 430*b*, 440*b*, 450*b* and 460*b* are performed for respective partial page program operations, and thus the deterioration of the reliability of the nonvolatile memory device may be prevented.

In still other embodiments, the random data page from which the random data is read may be selected randomly from the random data pages 410, 420, 430, 480 and 490 each time the random data read operation is performed. For example, as illustrated in FIG. 5, when a first partial page program operation is performed, a random data read operation for second random data page 420*b* may be performed, and when a subsequent second partial page program operation is performed, a random data read operation for sixth random data page 460*b* may be performed. Further, when a subsequent third partial page program operation is performed, a random data read operation for fourth random data page 440*b* may be performed. As described above, random data read operations for different random data pages 410*b*, 420*b*, 430*b*, 440*b*, 450*b* and 460*b* are performed for respective partial page program operations, and thus the deterioration of the reliability of the nonvolatile memory device may be prevented.

In still other embodiments, the random data page from which the random data is read may be selected from the random data pages 410, 420, 430, 480 and 490 by the memory controller. For example, as illustrated in FIG. 6, a random data block 400*c* comprises multiple random data pages 410*c*, 420*c* and 430*c*, and a memory controller may designate random data page 420*c* from which the random data is read by providing the nonvolatile memory device with an address of random data page 420*c* when the random data read operation is performed. As described above, memory controller 300 may designate the random data page each time the random data read operation is performed, and thus the deterioration of the reliability of the nonvolatile memory device may be prevented.

As described above, when the partial page program operation is performed, one random data page may be selected from the random data pages 410, 420, 430, 480 and 490 of random data block 400, and the random data is read from the selected random data page to the page buffer circuit. Accordingly, different random data may be programmed to respective user data pages in one user data block, and thus the deterioration of the reliability of the nonvolatile memory device may be prevented.

Figure 7:
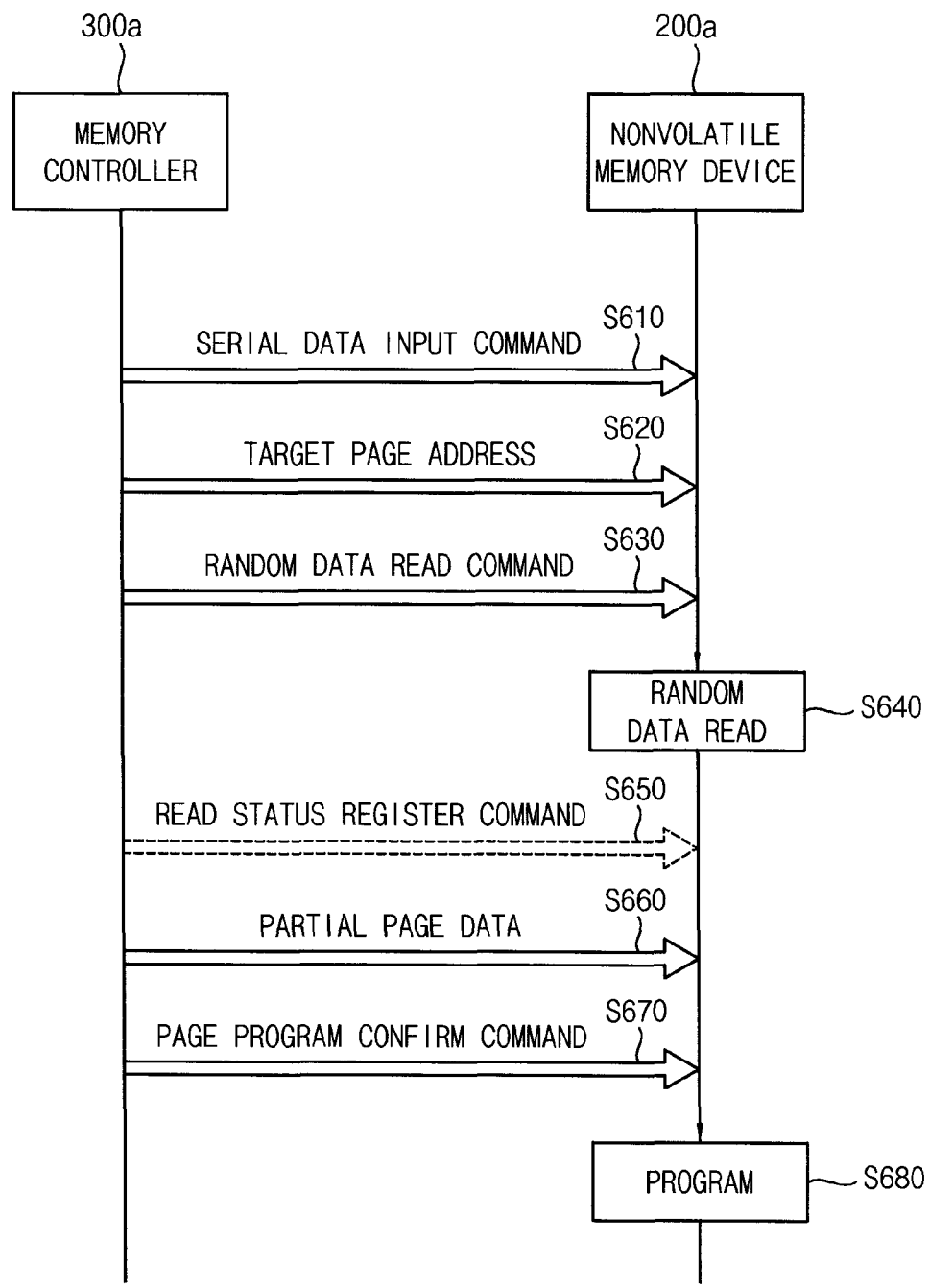
FIG. 7 is a diagram for describing a partial page program method according to an embodiment of the inventive concept.

FIG. 7 is a diagram for describing a partial page program method according to an embodiment of the inventive concept.

Referring to FIG. 7, to perform a partial page program operation, a memory controller 300*a* transfers a data input command to a nonvolatile memory device 200*a* (S610). For example, the data input command may be a serial data input command (e.g., 80h).

Memory controller 300*a* transfers an address of a target page to which partial page data is to be programmed to nonvolatile memory device 200*a* (S620). In some embodiments, memory controller 300*a* may transfer a row address of the target page to nonvolatile memory device 200*a*. For example, nonvolatile memory device 200*a* may receive the row address of the target page during three clock cycles. In other embodiments, memory controller 300*a* may transfer the row address of the target page and a column address indicating a start position of the partial page data in the target page to nonvolatile memory device 200*a*. For example, nonvolatile memory device 200*a* may receive the column address and the row address of the target page during five clock cycles.

Memory controller 300*a* may transfer a random data read command to nonvolatile memory device 200*a* (S630). The random data read command may have a value that is different from predefined command values (e.g., 00h, 05h, 10h, 11h, 30h, 35h, 60h, 70h, 7Bh, 80h, 81h, 85h, 90h, D0h, E0h, F1h, F2h, FFh, etc.) in the standard for the nonvolatile memory device.

Nonvolatile memory device 200*a* may load the random data to a page buffer circuit by reading the random data from a random data page corresponding to the address of the target page in response to the random data read command (S640). Accordingly, the random data may be first stored in the page buffer circuit. In some embodiments, the nonvolatile memory device comprises multiple random data pages, and a corresponding random data page among the random data pages may be designated for each user data page. Nonvolatile memory device 200*a* may select the random data page designated for the target page based on the address of the target page.

Memory controller 300*a* checks a time point at which a random data read operation is completed at nonvolatile memory device 300*a*. For example, memory controller 300*a* may monitor a ready/busy (R/B) output of nonvolatile memory device 200*a* to check the time point of the completion of the random data read operation. In other examples, memory controller 300*a* may transfer a read status register command to nonvolatile memory device 300*a* to check the time point of the completion of the random data read operation (S650). For example, the read status register command may have a value of 70h.

If the random data read operation is completed, memory controller 300*a* may transfer partial page data to nonvolatile memory device 200*a* (S660). Nonvolatile memory device 200*a* may load (or reload) the partial page data into the page buffer circuit. Accordingly, the page buffer circuit may store the partial page data in a portion where the partial page data is reloaded and the random data in the remaining portion.

After transferring the partial page data, memory controller 300a may transfer a page program confirm command to nonvolatile memory device 200a (S670). For example, the page program confirm command may have a value of 10h.

Nonvolatile memory device 200a may program page data stored in the page buffer circuit to the target page in response to the page program confirm command (S680). Accordingly, the partial page data may be programmed to a portion of the target page, and the random data may be programmed to the remaining portion of the target page.

As described above, in the partial page program method according to an embodiment of the inventive concept, the random data stored in nonvolatile memory device 200a may be loaded into the page buffer circuit before the partial page data is input to nonvolatile memory device 200a, and thus randomized data may be programmed to the entire target page without full-page data loading from memory controller 300a. Further, because not the full-page data but the partial page data is input from memory controller 300a to nonvolatile memory device 200a, the data input time and the program time may be reduced by the partial page program method according to an embodiment of the inventive concept.

Figure 8:
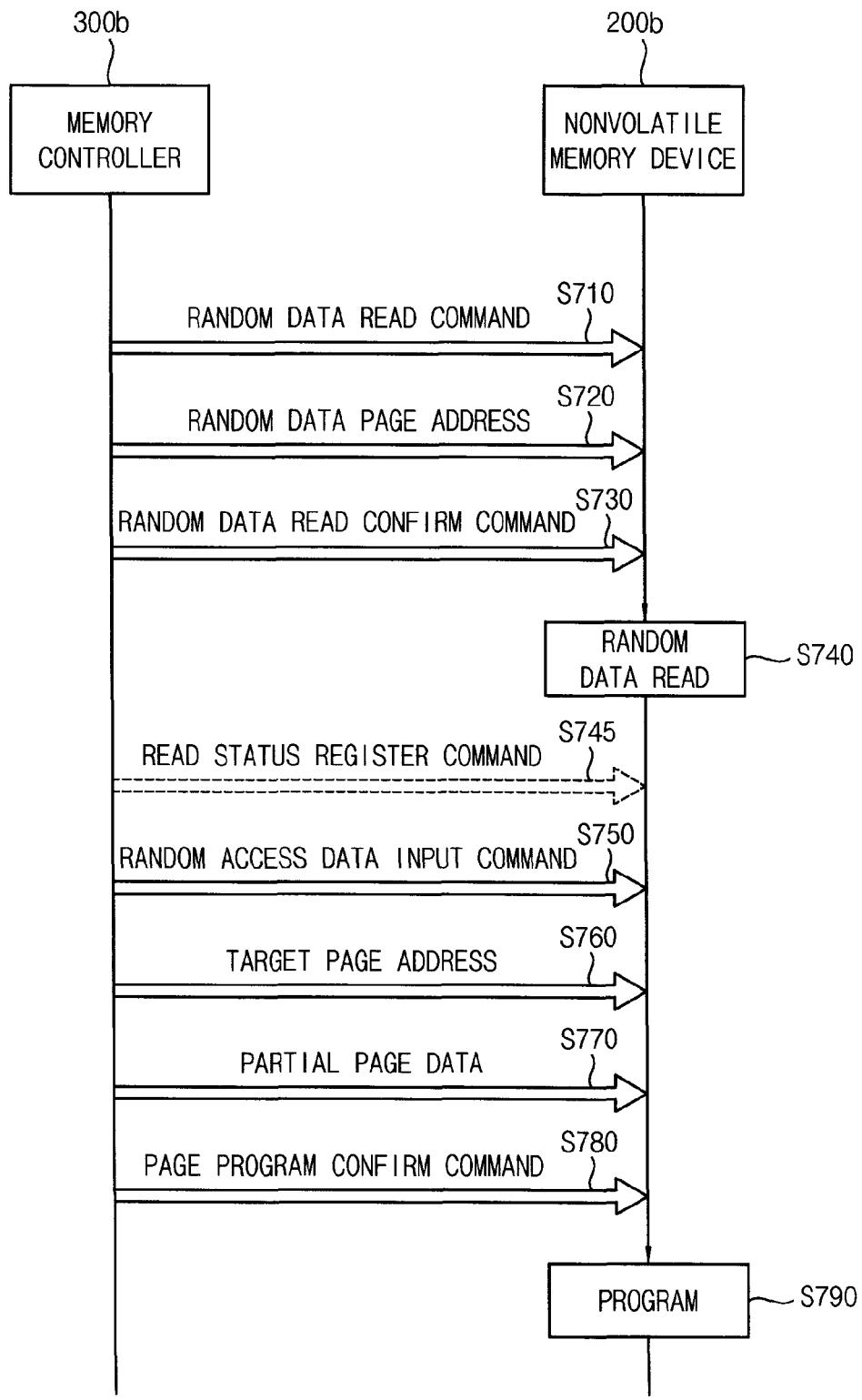
FIG. 8 is a diagram for describing a partial page program method according to an embodiment of the inventive concept.

FIG. 8 is a diagram for describing a partial page program method according to an embodiment of the inventive concept.

Referring to FIG. 8, to perform a partial page program operation, a memory controller 300b transfers a random data read command to a nonvolatile memory device 200b (S710). For example, the random data read command may have a value that is different from predefined command values (e.g., 00h, 05h, 10h, 11h, 30h, 35h, 60h, 70h, 7Bh, 80h, 81h, 85h, 90h, D0h, E0h, F1h, F2h, FFh, etc.) in the standard for the nonvolatile memory device.

After transferring the random data read command, memory controller 300b may transfer an address of a random data page to nonvolatile memory device 200b (S720). For example, memory controller 300b may transfer a row address of the random data page to nonvolatile memory device 200b, or may transfer row and column addresses of the random data page to nonvolatile memory device 200b.

After transferring the address of the random data page, memory controller 300b may transfer a random data read confirm command to nonvolatile memory device 200b (S730). For example, the random data read confirm command may have a value that is different from predefined command values (e.g., 00h, 05h, 10h, 11h, 30h, 35h, 60h, 70h, 7Bh, 80h, 81h, 85h, 90h, D0h, E0h, F1h, F2h, FFh, etc.) in the standard for the nonvolatile memory device.

Nonvolatile memory device 200b may load random data to a page buffer circuit by reading the random data from the random data page having the received address in response to the random data read confirm command (S740). Accordingly, the random data may be first stored in the page buffer circuit.

Memory controller 300a checks a time point of completion of a random data read operation by monitoring an RIB output of nonvolatile memory device 200b, or by transferring a read status register command to nonvolatile memory device 300b (S745).

If the random data read operation is completed, memory controller 300b may transfer a data input command to nonvolatile memory device 200b (S750). For example, the data input command may be a random access data input command (e.g., 85h).

After transferring the data input command, memory controller 300b may transfer an address of a target page to which partial page data is to be programmed to nonvolatile memory device 200a (S760). For example, memory controller 300b may transfer a row address of the target page to nonvolatile memory device 200b, or may transfer row and column addresses of the target page to nonvolatile memory device 200b.

After transferring the address of the target page, memory controller 300b may transfer partial page data to nonvolatile memory device 200b (S770). Nonvolatile memory device 200b may load (or reload) the partial page data into the page buffer circuit. Accordingly, the page buffer circuit may store the partial page data in a portion where the partial page data is reloaded and the random data in the remaining portion.

After transferring the partial page data, memory controller 300b may transfer a page program confirm command to nonvolatile memory device 200b (S780). For example, the page program confirm command may have a value of 10h.

Nonvolatile memory device 200b may program page data stored in the page buffer circuit to the target page in response to the page program confirm command (S790). Accordingly, the partial page data may be programmed to a portion of the target page, and the random data may be programmed to the remaining portion of the target page.

As described above, in the partial page program method according to an embodiment of the inventive concept, the random data stored in nonvolatile memory device 200b is loaded into the page buffer circuit before the partial page data is input to nonvolatile memory device 200b, and thus randomized data may be programmed to the entire target page without full-page data loading from memory controller 300b. Further, because not the full-page data but the partial page data is input from memory controller 300b to nonvolatile memory device 200b, the data input time and the program time may be reduced by the partial page program method according to an embodiment of the inventive concept.

Figure 9:
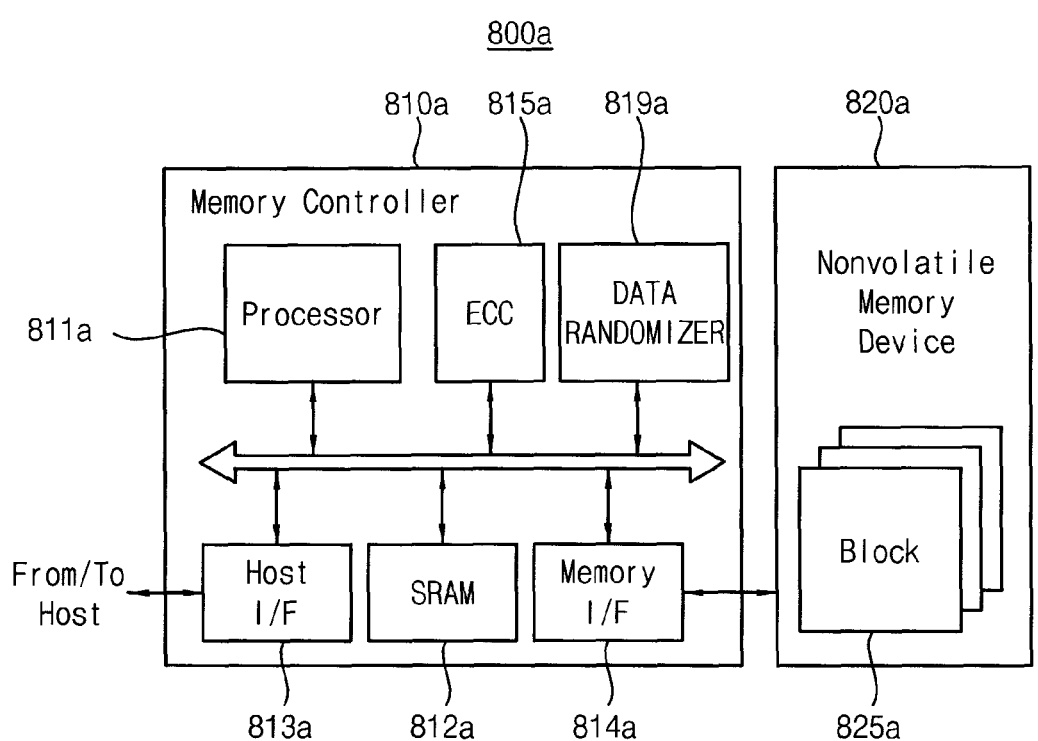
FIG. 9 is a block diagram illustrating a memory system comprising a memory controller and a nonvolatile memory device according to an embodiment of the inventive concept.

FIG. 9 is a block diagram illustrating a memory system comprising a memory controller and a nonvolatile memory device according to an embodiment of the inventive concept.

Referring to FIG. 9, a memory system 800a comprises a memory controller 810a and a nonvolatile memory device 820a.

Nonvolatile memory device 820a comprises multiple memory blocks 825a. In some embodiments, at least one of memory blocks 825a may be designated as a random data block. Random data (or randomized data) may be previously stored in the random data block. When a partial page program operation is performed, nonvolatile memory device 820a may load the random data stored in the random data block into a page buffer circuit before partial page data is input to nonvolatile memory device 820a, and thus may program randomized data to the entire target page without full-page data loading from memory controller 810a. Further, because not the full-page data but the partial page data is input from memory controller 810a to nonvolatile memory device 820a, the data input time and the program time may be reduced.

Memory controller 810a may control nonvolatile memory device 820a. Memory controller 810a may control data transfer between an external host and nonvolatile memory device 820a. Memory controller 810a comprises a processor

811*a*, such as a central processing unit (CPU), a buffer memory 812*a*, a host interface 813*a*, a memory interface 814*a* and an error correction code (ECC) block 815*a*. In some embodiments, memory controller 810*a* may further comprise a data randomizer 819*a*. Data randomizer 819*a* may randomize user data to provide nonvolatile memory device 820*a* with the randomized user data, and may de-randomize the randomized user data read from nonvolatile memory device 820*a* to provide the external host with the original user data.

Processor 811*a* may perform operations for the data transfer. In some embodiments, buffer memory 812*a* may be implemented by a static random access memory (SRAM). In other embodiments, a dynamic random access memory (DRAM), a phase random access memory (PRAM), a ferroelectric random access memory (FRAM), a resistive random access memory (RRAM), a magnetic random access memory (MRAM), etc. According to an embodiment of the inventive concept, buffer memory 812*a* may be located inside or outside memory controller 810*a*.

Host interface 813*a* is coupled to the host, and memory interface 814*a* is coupled to nonvolatile memory device 820*a*. Processor 811*a* communicates with the host via host interface 813*a*. For example, host interface 813*a* may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, processor 811*a* may communicate with nonvolatile memory device 820*a* via memory interface 814*a*. In some embodiments, ECC block 815*a* may perform ECC encoding and ECC decoding by using a Bose-Chaudhuri-Hocquenghem (BCH) code. In other embodiments, ECC block 815*a* may perform the ECC encoding and the ECC decoding by using a low density parity check (LDPC) code. In still other embodiments, ECC block 815*a* may perform the ECC encoding and the ECC decoding by using a turbo code, a Reed-Solomon code, a convolution code, a recursive systematic code (RSC), a coded modulation, such as a trellis-coded modulation (TCM), a block coded modulation (BCM), etc., or other error correction codes. According to an embodiment of the inventive concept, memory controller 810*a* may be built in nonvolatile memory device 820*a*, or memory controller 810*a* and nonvolatile memory device 820*a* may be implemented as separate chips.

Memory system 800*a* may be implemented as a memory card, an SSD, etc. In some embodiments, nonvolatile memory device 820*a*, memory controller 810*a* and/or memory system 800*a* may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 10:
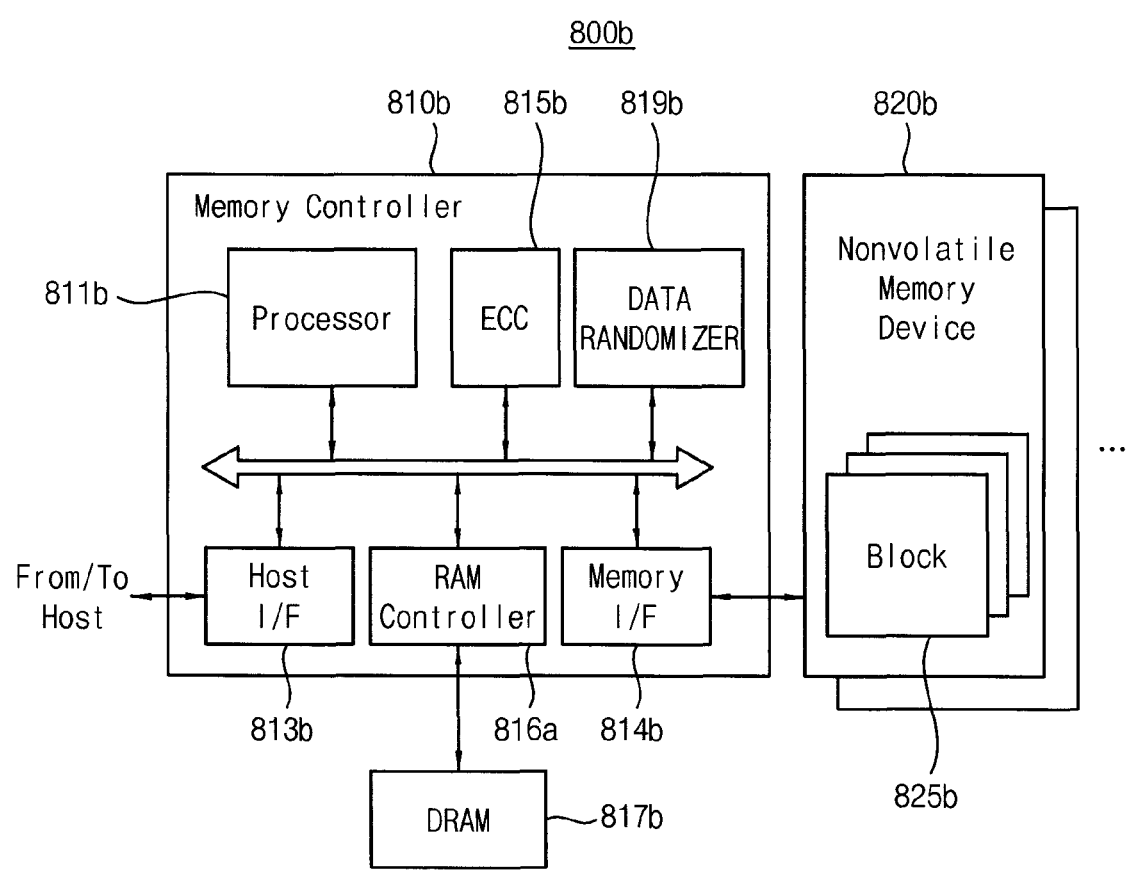
FIG. 10 is a block diagram illustrating a memory system comprising a memory controller and a nonvolatile memory device according to an embodiment of the inventive concept.

FIG. 10 is a block diagram illustrating a memory system 800*b* comprising a memory controller and a nonvolatile memory device according to an embodiment of the inventive concept.

Referring to FIG. 10, memory system 800*b* comprises a memory controller 810*b*, a nonvolatile memory device 820*b* and a buffer memory 817*b*. In some embodiments, buffer memory 817*b* may be a dynamic random access memory (DRAM), and may be located outside memory controller 810*b*. Memory controller 810*b* comprises a processor 811*b*, a host interface 813*b*, a memory interface 814*b*, an ECC block 815*b* and a random access memory (RAM) controller 816*b* for controlling buffer memory 817*b*. In some embodiments, memory controller 810*b* may further comprise a data randomizer 819*b* for randomizing and/or de-randomizing user data. Nonvolatile memory device 820*b* comprises multiple memory blocks 825*b*, and at least one of memory blocks 825*b* may be designated as a random data block. Memory system 800*b* of FIG. 10 may have similar configurations and operations to a memory system 800*a* of FIG. 9, except that buffer memory 817*b* is located outside memory controller 810*b*.

Figure 11:
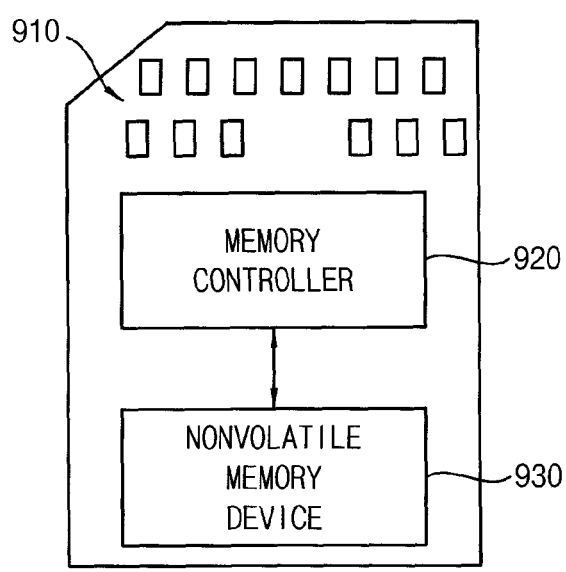
FIG. 11 is a diagram illustrating a memory card comprising a memory system according to an embodiment of the inventive concept.

FIG. 11 is a diagram illustrating a memory card 900 comprising a memory system according to an embodiment of the inventive concept.

Referring to FIG. 11, memory card 900 comprises multiple connecting pins 910, a memory controller 920 and a nonvolatile memory device 930.

Connecting pins 910 may be coupled to a host to transfer signals between the host and memory card 900. Connecting pins 910 comprises a clock pin, a command pin, a data pin and/or a reset pin.

Memory controller 920 may receive data from the host, and may store the received data in nonvolatile memory device 930. Nonvolatile memory device 930 comprises at least one random data block that stores random data. Where a partial page program operation is performed, nonvolatile memory device 930 may load the random data stored in the random data block into a page buffer circuit before partial page data is input to nonvolatile memory device 930, and thus may program randomized data comprising the partial page data and the random data to the entire target page without full-page data loading from memory controller 920. Further, because not the full-page data but the partial page data is input from memory controller 920 to nonvolatile memory device 930, the data input time and the program time may be reduced.

For example, memory card 900 comprises a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some embodiments, memory card 900 may be attachable to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 12:
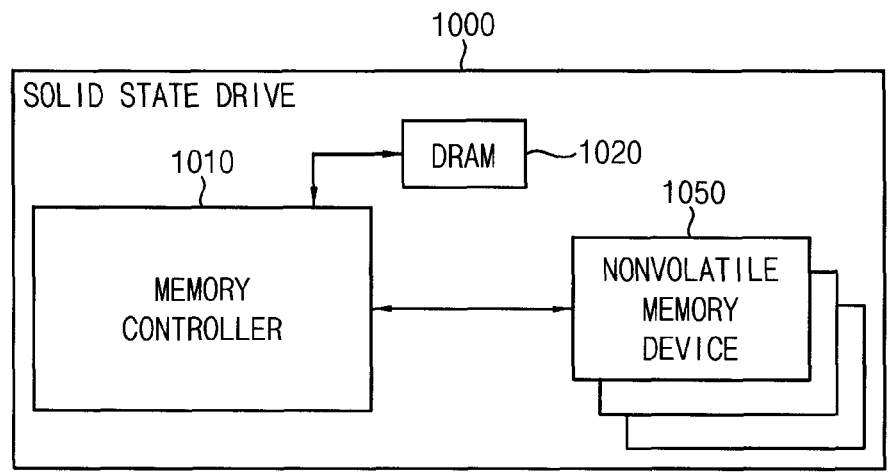
FIG. 12 is a diagram illustrating a solid state drive (SSD) comprising a memory system according to an embodiment of the inventive concept.

FIG. 12 is a diagram illustrating an SSD 1000 comprising a memory system according to an embodiment of the inventive concept.

Referring to FIG. 12, SSD 1000 comprises a memory controller 1010, a buffer memory 2420, and multiple nonvolatile memory devices 1050.

Memory controller 1010 receives data from a host, and it stores the received data in nonvolatile memory devices 1050. Buffer memory 2420 temporarily stores data transferred between the host and the nonvolatile memory devices 1050, and may be implemented by a DRAM located outside memory controller 1010.

Each nonvolatile memory device 1050 comprises at least one random data block that stores random data. Where a partial page program operation is performed, nonvolatile memory device 1050 may load the random data stored in the random data block into a page buffer circuit before partial page data is input to nonvolatile memory device 1050, and thus may program randomized data comprising the partial page data and the random data to the entire target page without full-page data loading from memory controller 1010. Further, because not the full-page data but the partial page data is input from memory controller 1010 to nonvolatile memory device 1050, the data input time and the program time may be reduced.

In some embodiments, solid state drive 1000 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 13:
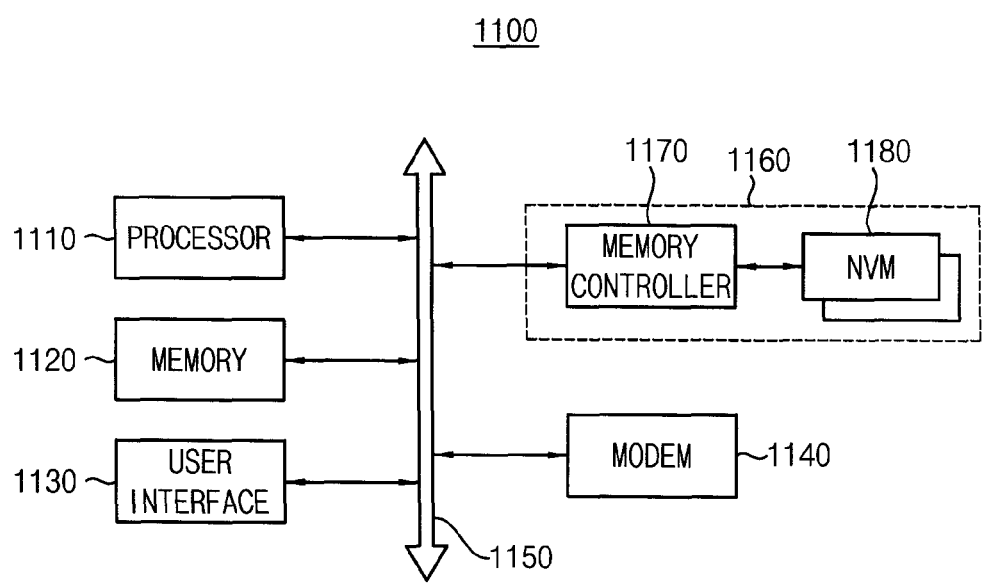
FIG. 13 is a diagram illustrating a computing system according to an embodiment of the inventive concept.

FIG. 13 is a diagram illustrating a computing system 1100 according to an embodiment of the inventive concept.

Referring to FIG. 13, computing system 1100 comprises a processor 1110, a memory device 1120, a user interface 1130, a bus 1150 and a memory system 1160. In some embodiments, computing system 1100 may further comprise a modem 1140, such as a baseband chipset.

Processor 1110 may perform specific calculations or tasks. For example, processor 1110 may be a microprocessor, a central processing unit (CPU), a digital signal processor, or the like. Processor 1110 may be coupled to memory device 1120 via a bus 1150, such as an address bus, a control bus and/or a data bus. For example, memory device 1120 may be implemented by a DRAM, a mobile DRAM, a SRAM, a PRAM, a FRAM, a RRAM, a MRAM and/or a flash memory. Further, processor 1110 may be coupled to an extension bus, such as a peripheral component interconnect (PCI) bus, and may control user interface 1130 comprising at least one input device, such as a keyboard, a mouse, a touch screen, etc., and at least one output device, a printer, a display device, etc. Modem 1140 may perform wired or wireless communication with an external device. Nonvolatile memory device 1180 of memory system 1160 may be controlled by a memory controller 1170 to store data processed by processor 1110 or data received via modem 1140. In some embodiments, computing system 1100 may further comprise a power supply, an application chipset, a camera image processor (CIS), etc.

The inventive concept may be applied to any nonvolatile memory device, such as a flash memory device, and devices and systems comprising the nonvolatile memory device. For example, the inventive concept may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, etc.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A partial page programming method for a system comprising a memory controller and a nonvolatile memory device, the method comprising:
    loading random data stored in the nonvolatile memory device to a page buffer circuit of the nonvolatile memory device, wherein the random data is data that is generated by randomizing given data;
    reloading partial page data having a size corresponding to a portion of one page to the page buffer circuit after the loading of the random data, wherein the partial page data is received from the memory controller; and
    programming page data including a combination of a portion of the random data and the partial page data stored in the page buffer circuit to a target page,
    wherein the nonvolatile memory device comprises a memory cell array including a plurality of data blocks including a random data block and a user data block,
    the loading of the random data comprises reading the random data from a random data page of the random block using a random data read operation, and
    the target page is a page of the user data block, and
    wherein the random data page is randomly selected from multiple random data pages of the random data block.

2. The method of claim 1, wherein a read time for the random data read operation is shorter than a read time for a user data read operation during which the memory controller reads data stored in a user data page of the user data block.

3. The method of claim 2, wherein a precharge time and a sensing time of the random data read operation are respectively shorter than a precharge time and a sensing time of the user data read operation.

4. The method of claim 1, wherein the random data read from the random data page is not output by the nonvolatile memory device to the memory controller.

5. The method of claim 1, wherein the user data block comprising the target page is a multi-level memory cell block, and the random data block comprising the random data page is a single level memory cell block.

6. The method of claim 1, wherein random data stored in the random data block is periodically updated.

7. A partial page programming method for a system comprising a memory controller and a nonvolatile memory device, the method comprising:
    loading random data stored in the nonvolatile memory device to a page buffer circuit of the nonvolatile memory device, wherein the random data is data that is generated by randomizing given data;
    reloading partial page data having a size corresponding to a portion of one page to the page buffer circuit after the loading of the random data, wherein the partial page data is received from the memory controller; and
    programming page data including a combination of a portion of the random data and the partial page data stored in the page buffer circuit to a target page,
    wherein the nonvolatile memory device comprises a memory cell array including a plurality of data blocks including a random data block and a user data block,
    the loading of the random data comprises reading the random data from a random data page of the random block using a random data read operation, and
    the target page is a page of the user data block, and
    wherein the partial page programming method further comprises:
    executing a number of random data read operations directed to the random data block; and upon determining that the executed number of random data read operations exceeds a predetermined value, updating the random data stored in the random data block.

8. The method of claim 7, wherein the loading of the random data further comprises:
receiving an address of the target page from the memory controller; and
receiving a random data read command from the memory controller, and
wherein reading the random data from the random data page of the random data block is performed in response to the address of the target page and the random data read command.

9. The method of claim 7, wherein the loading of the random data further comprises:
receiving a random data read command from the memory controller;
receiving an address of a random data page from the memory controller; and
receiving a random data read confirm command from the memory controller, and
wherein reading the random data from the random data page of the random data block is performed in response to the random data read command, the address of the random data page, and the random data read confirm command.

10. A system, comprising:
a memory controller; and
a nonvolatile memory device comprising a page buffer circuit and a memory cell array including a plurality of data blocks including a random data block and a user data block,
wherein the nonvolatile memory device is configured to store random data in the random data block, wherein the random data is data that is generated by randomizing given data,
load a page of the stored random data to the page buffer circuit using a random data read operation in response to a random data read command and a random data page address received from the memory controller,
after the loading of the random data to the page buffer, reload partial page data received from the memory controller having a size corresponding to a portion of a page to the page buffer circuit, and
programming page data including a combination of a portion of the random data and the partial page data stored in the page buffer circuit to a target page of the user data block using a user data read operation, and
wherein the nonvolatile memory device is configured to execute a number of random data read operations directed to the random data block, and,
upon determining that the executed number of random data read operations exceeds a predetermined value, update the random data stored in the random data block.

11. The system of claim 10, wherein the nonvolatile memory device loads the random data by reading the random data from a random data page selected by the memory controller from among multiple random data pages of the random data block.

12. The system of claim 11, wherein a read time for the random data read operation is shorter than a read time for the user data read operation.

* * * * *